United States Patent
Chen et al.

(10) Patent No.: US 8,787,092 B2
(45) Date of Patent: Jul. 22, 2014

(54) PROGRAMMING INHIBIT METHOD OF NONVOLATILE MEMORY APPARATUS FOR REDUCING LEAKAGE CURRENT

(75) Inventors: Wei-Ren Chen, Pingtung County (TW); Te-Hsun Hsu, Hsinchu County (TW); Hsin-Ming Chen, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 140 days.

(21) Appl. No.: 13/418,352

(22) Filed: Mar. 13, 2012

(65) Prior Publication Data

US 2013/0242663 A1  Sep. 19, 2013

(51) Int. Cl.
*G11C 16/04* (2006.01)
*G11C 16/10* (2006.01)

(52) U.S. Cl.
CPC ..................... *G11C 16/10* (2013.01)
USPC ............ 365/185.18; 365/185.17; 365/185.03; 365/185.19; 365/185.01; 365/185.14

(58) Field of Classification Search
CPC ............... G11C 16/0483; G11C 16/10; G11C 2211/5624; G11C 2211/5631; G11C 11/5628; G11C 2211/5621; G11C 27/005; G11C 16/3454; G11C 16/3459
USPC ............. 365/185.17, 185.03, 185.18, 185.19, 365/185.01, 185.14
See application file for complete search history.

(56) References Cited

U.S. PATENT DOCUMENTS 7,233,522 B2  6/2007  Chen et al.
2006/0034121 A1* 2/2006 Khalid et al. ............ 365/185.19

FOREIGN PATENT DOCUMENTS

JP      2000149581      5/2000

OTHER PUBLICATIONS

"Office Action of Japan counterpart application" issued on Aug. 13, 2013, p. 1-p. 2.

* cited by examiner

*Primary Examiner* — Thong Q Le
(74) *Attorney, Agent, or Firm* — Jianq Chyun IP Office

(57) ABSTRACT

The invention provides a nonvolatile memory apparatus. The nonvolatile memory apparatus comprises a plurality of memory cells and a signal generator. The memory cells are arranged in an array, and each of the memory cells has a control gate terminal, a floating gate, a source line terminal, a bit-line terminal, a selected gate terminal and a word-line terminal. The signal generator is coupled to the memory cells. When the nonvolatile memory apparatus executes a programming operation, the signal generator provides a programming signal to the control gate terminals of a plurality of inhibited memory cells among the memory cells. Wherein, the programming signal is a pulse signal with a direct-current (DC) offset voltage.

6 Claims, 6 Drawing Sheets

PROGRAMMING INHIBIT METHOD OF NONVOLATILE MEMORY APPARATUS FOR REDUCING LEAKAGE CURRENT

BACKGROUND OF THE INVENTION

1. Field of Invention

The present invention generally relates to a nonvolatile memory apparatus, and more particularly to a nonvolatile memory apparatus for reducing leakage current.

2. Description of Prior Art

Along with the rapid development of science and technology at the present, nonvolatile memories are widely used in a portable electrical apparatus. For providing the portable electrical apparatus with high performance, the low power consumption of the nonvolatile memories used in the portable electrical apparatus is very important. Hence, a flash memory is considered to operate under Fowler-Nordheim (FN) functional form for advance technique.

In the prior art, the programming signals provided to the control terminal of the flash memory cells are kept at a relative high voltage level. For the memory cells for programming, the voltage level of the bit line signals which equal to a ground voltage (0 volt) are provided to the programmed memory cells. For the memory cells which are inhibited from programmed, the voltage level of the bit line signals which larger than ground voltage are provide to the inhibited memory cells.

When a prior art flash memory apparatus executes a programming operation, the programming signal with a high voltage is applied to the memory cells which are inhibited from program, and a bit signal with a voltage level larger than 0 volts is applied to the inhibited memory cells. The channel signal of floating gate is generated by a self-booting effect through an effective boosting capacitor, and the control signal is applied to the floating gates of the inhibited memory cells. The control signal is kept at the high voltage till the programming operation is complete. Therefore, there are many kinds of leakage currents can be occurred on the inhibited memory cells, such as channel leakage current, junction leakage current and leakage current from selecting gates or source line of the inhibited memory cells.

SUMMARY OF THE INVENTION

The present invention provides a nonvolatile memory apparatus for reducing leakage current and preventing inhibited cell fail when the nonvolatile memory apparatus is processing a programming process.

The nonvolatile memory apparatus comprises a plurality of memory cells and a signal generator. The memory cells are arranged in an array, and each of the memory cells has a control gate terminal, a floating gate, a source line terminal, a bit-line terminal, a selected gate terminal and a word-line terminal. The signal generator is coupled to the memory cells. When the nonvolatile memory apparatus executes a programming operation, the signal generator provides a programming signal to the control gate terminals of a plurality of inhibited memory cells among the memory cells. Wherein, the programming signal is a pulse signal with a direct-current (DC) offset voltage.

Accordingly, the signal generator of the nonvolatile memory apparatus provides a programming signal to the floating gates of the inhibited memory cells when the nonvolatile memory apparatus executes a programming process, and the programming signal equals to a pulse signal with a direct-current (DC) offset voltage. That is, the programming signal does not keep on the fixed high voltage level when the nonvolatile memory apparatus executing a programming process, such as that, the leakage current resulting in inhibit cells fail can be reduced. Moreover, the programming signal also does not affect the programming function for programmed memory cells.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
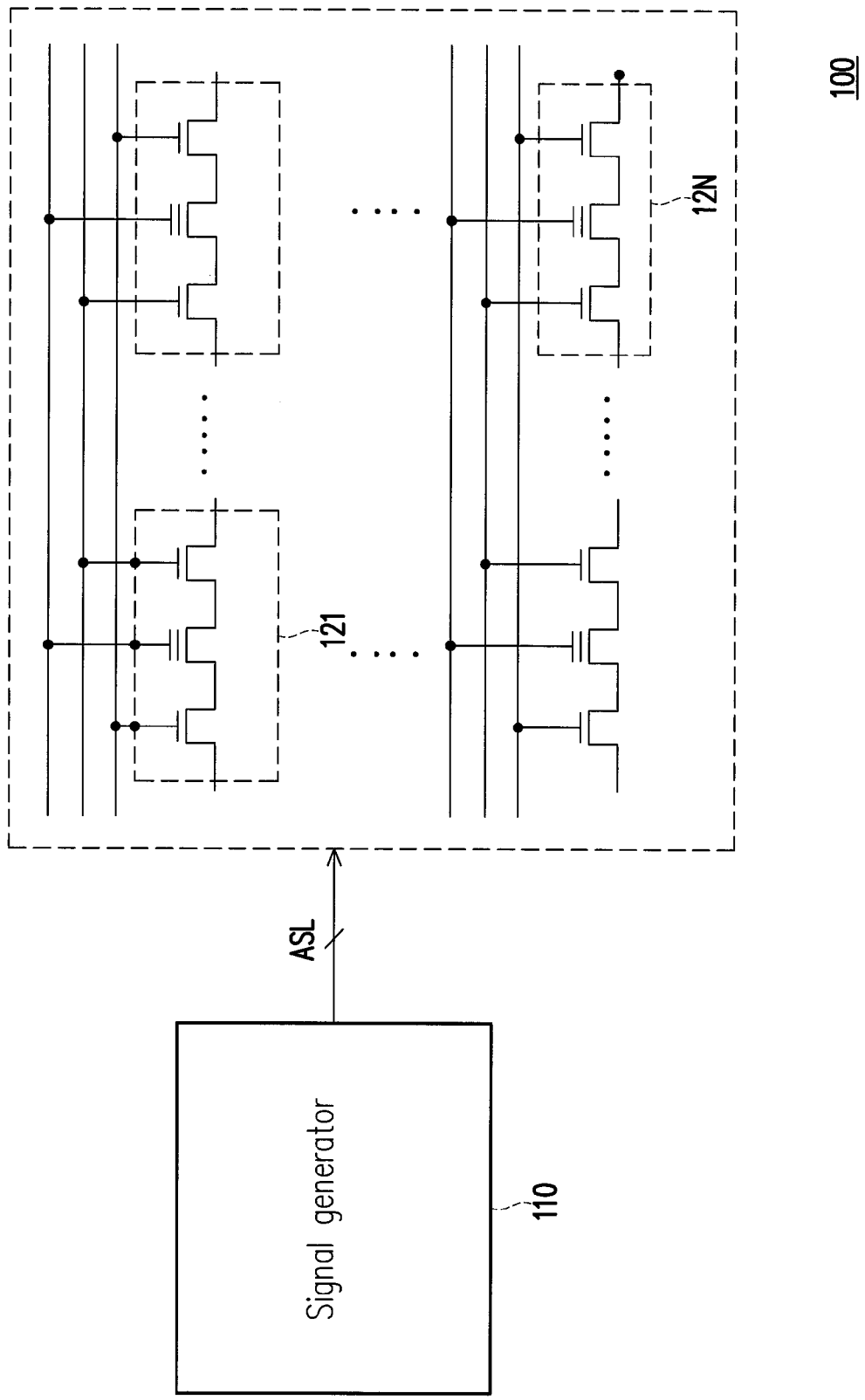
FIG. 1 is a block diagram of a nonvolatile memory apparatus 100 according to an embodiment of the present invention.

Reference will now be made in detail to the present preferred embodiment of the invention, examples of which are illustrated in the accompanying drawings. Wherever possible, the same reference numbers are used in the drawings and the description to refer to the same or like parts.

Referring to FIG. 1, FIG. 1 is a block diagram of a nonvolatile memory apparatus 100 according to an embodiment of the present invention. The nonvolatile memory apparatus 100 is a flash memory apparatus, and the nonvolatile memory apparatus 100 includes a signal generator 110 and a plurality of memory cells 121~12N. The memory cells 121~12N are arranged in an array 120. The signal generator 110 is coupled to the memory cells 121~12N and provides a plurality of signals ASL for accessing the memory cells 121~12N. The signals ASL includes a programming signal which comprises a pulse signal with a direct-current (DC) offset voltage, word-line signals, bit-line signals, selecting gate signals and source line signals.

Figure 2:
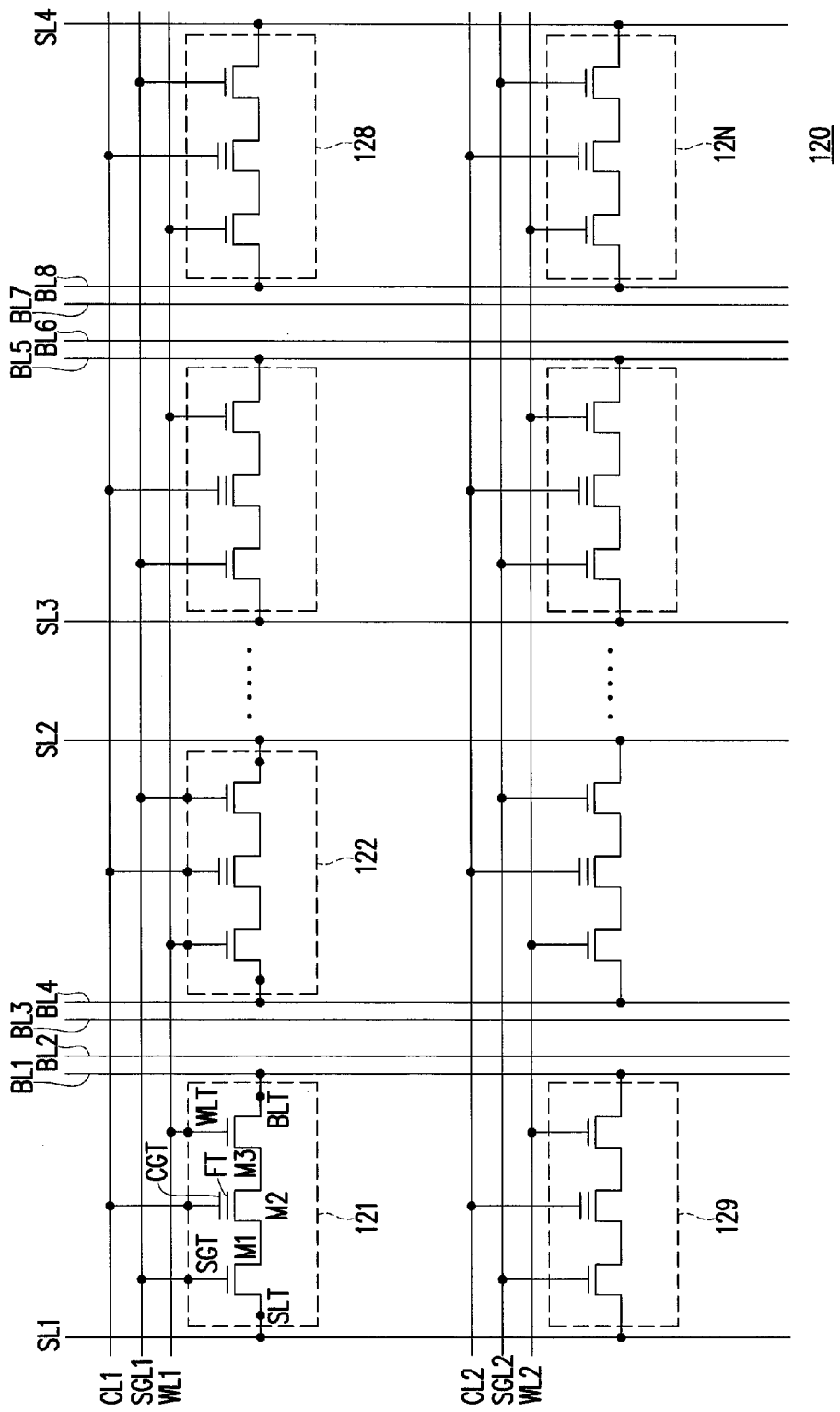
FIG. 2 is an embodiment of the circuit diagram of the array 120.

Referring to FIG. 1 and FIG. 2, wherein FIG. 2 is an embodiment of the circuit diagram of the array 120. There are a plurality memory cells 121~12N in the array 120. Each of the memory cells 121~12N, for example the memory cell 121, has a control gate terminal CGT, a floating gate FT, a source line terminal SLT, a bit-line terminal BLT, a selected gate terminal SGT and a word-line terminal WLT. In FIG. 2, the signal lines CL1 and CL2 are used to transport the programming signal to the floating gates FT of the memory cells 121~12N. The signal lines SGL1 and SGL2 are used to transport the selecting gate signals to the selecting gate terminals SGT of the memory cells 121~12N. The signal lines WL1 and WL2 are used to transport the word-line signals to the word-line terminals WLT of the memory cells 121~12N. The signal lines SL1-SL4 are used to transport the source line signal to the source line terminals SLT of the memory cells 121~12N. Moreover, the signal lines BL1-BL8 are used to transport bit-line signals to the bit-line terminals BLT of the memory cells 121~12N. The signal lines CL1-CL2, SGL1-SGL2, WL1-WL2, SL1-SL4 and BL1-BL8 are all coupled to the signal generator 110.

When the nonvolatile memory apparatus executes a programming operating, if the memory cell 121 is inhibited from the programming operating, and the memory cell 129 is set to be programmed. The signal line CL1 and signal line CL2 are used to transport the programming signal to the floating gate FT of the memory cell 121 and memory cell 129 through the control gate terminal CGT of the memory cell 121 and memory cell 129 respectively; moreover, a voltage level of the bit-line signal transported to the inhibited memory cell 121 is set at relative high voltage level and a voltage level of the bit-line signal transported to the non-inhibited memory cell 129 is set at 0V. Please notice here, the programming signal is a pulse signal with a direct-current (DC) offset voltage, Wherein, the voltage level of the DC offset voltage is larger than 0 volt, and the pulse signal is a periodical signal. In some embodiments, the voltage level of the bit line signal provided to the inhibited memory cell 121 can be equal to the DC offset voltage mentioned above.

Figure 3:
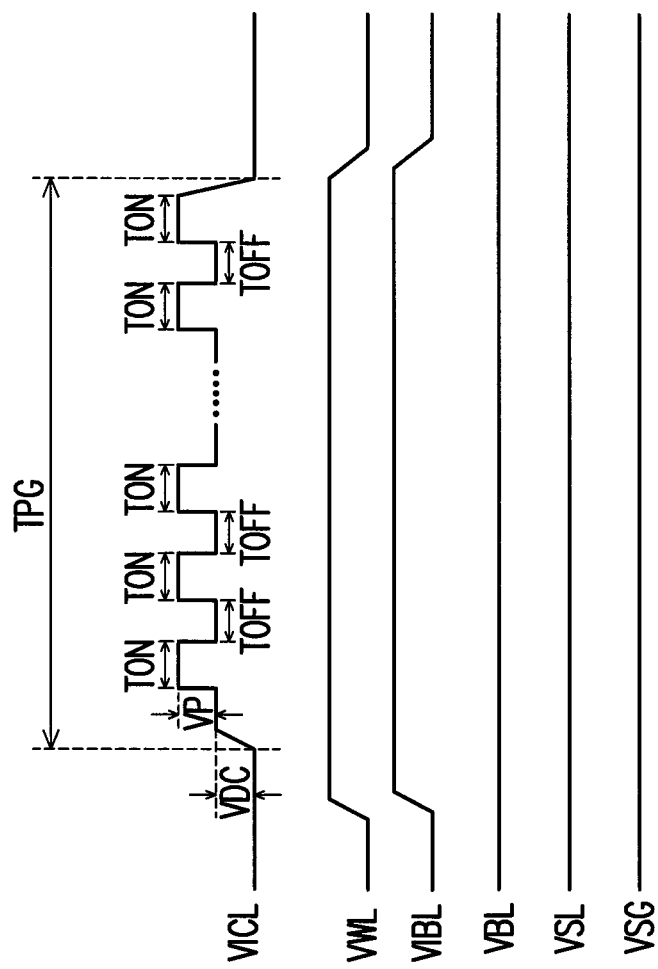
FIG. 3 illustrates waveforms of signals transporting to the memory cells 121~12N.

Referring to FIG. 3 and FIG. 2, FIG. 3 illustrates waveforms of signals transporting to the memory cells 121~12N. In FIG. 3, during a time period TPG for executing the programming operation, the programming signal VICL is provided to the memory cell 121 through the signal line CL1, and the programming signal VICL is also provided to the memory cell 129 through the signal line CL2. The programming signal VICL is a pulse signal with a DC offset voltage VDC, and the maximum voltage amplitude is equaled to the summation of the voltage VP and the DC offset voltage VDC. That is, the voltage level of the programming signal VICL is equaled to the summation of the voltage VP and the DC offset voltage VDC in the time period TON, and the voltage level of the programming signal VICL is equaled to the voltage level of the DC offset voltage VDC.

On the other hand, the word-line signal VWL can be provided to the word-line terminals WLT of the inhibited memory cells during the time period TPG, and the voltage level of the word-line signal VWL can be equaled to or larger than the voltage of the DC offset voltage VDC. The bit-line signal VIBL can be provided to the bit-line terminals BLT of the inhibited memory cells during the time period TPG, and the voltage level of the bit-line signal VIBL can be equaled to or larger than the voltage of the DC offset voltage VDC. Moreover, the bit-line signal VBL can be provided to the bit-line terminals BLT of the non-inhibited memory cells during the time period TPG, and the voltage level of the bit-line signal VBL can be equaled to 0V. The source line signal VSL and the selecting gate signal VSG are provided to the source line terminals SLT and the selecting gate terminals SGT of all of the memory cells 121-12N, respectively. The voltage levels of the selecting gate signal VSG are equaled to a ground voltage (0 volts), and the voltage level of the source line signal VSL can be equaled to or larger than the ground voltage (0 volts).

Referring to FIG. 2 again, the memory cell 121 includes a transistor M1, a floating gate transistor M2 and a transistor M3. The transistor M1 has a first terminal, a second terminal and a control terminal. The first terminal of the transistor M1 is coupled to the source line terminal SLT, the control terminal of the transistor M1 is coupled to the selected gate terminal SGT. The floating gate transistor M2 has a first terminal, a second terminal and a control terminal, the first terminal of the floating gate transistor M2 is coupled to the second terminal of the transistor M1, the control terminal of the floating gate transistor M2 is coupled to the floating gate FT. The transistor M3 has a first terminal, a second terminal and a control terminal, the first terminal of the transistor M3 is coupled to the second terminal of the floating gate transistor M2, the control terminal of the transistor M3 is coupled to the word-line terminal WLT, and the second terminal of the transistor M3 is coupled to the bit-line terminal BLT.

Figure 4:
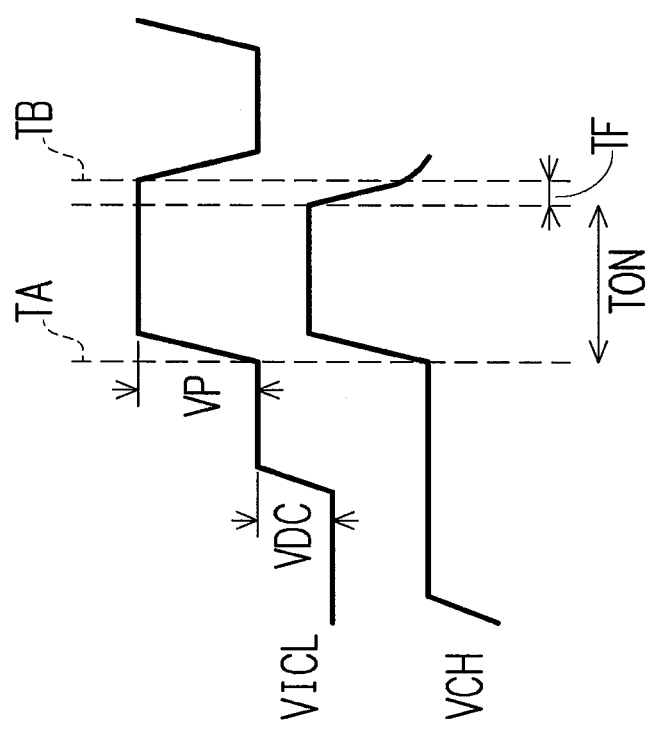
FIG. 4 illustrates a relationship between a programming signal VICL and a channel voltage VCH.

Referring to FIG. 3 and FIG. 4, FIG. 4 illustrates a relationship between a programming signal VICL and a channel voltage VCH. The channel voltage VCH is a voltage level on the channel of the floating gate transistor M2. When the programming signal VICL is boosted at time TA, and the channel voltage VCH of the floating gate transistor M2 is raised up correspondingly. When the programming signal VICL reaches the maximum voltage level (VP+VDC), the channel voltage VCH of the floating gate transistor M2 is boosted to almost equal to the voltage level VP+VDC. On the other hand, during the time period TF, the voltage level of the channel voltage VCH is reduced result by charge leak. At time TB, the boost action of the programming signal VICL is failed, the voltage level of the channel voltage VCH is reduced correspondingly, and electron injected from channel of transistor M2 by Fowler-Nordheim (FN) effect.

Figure 5:
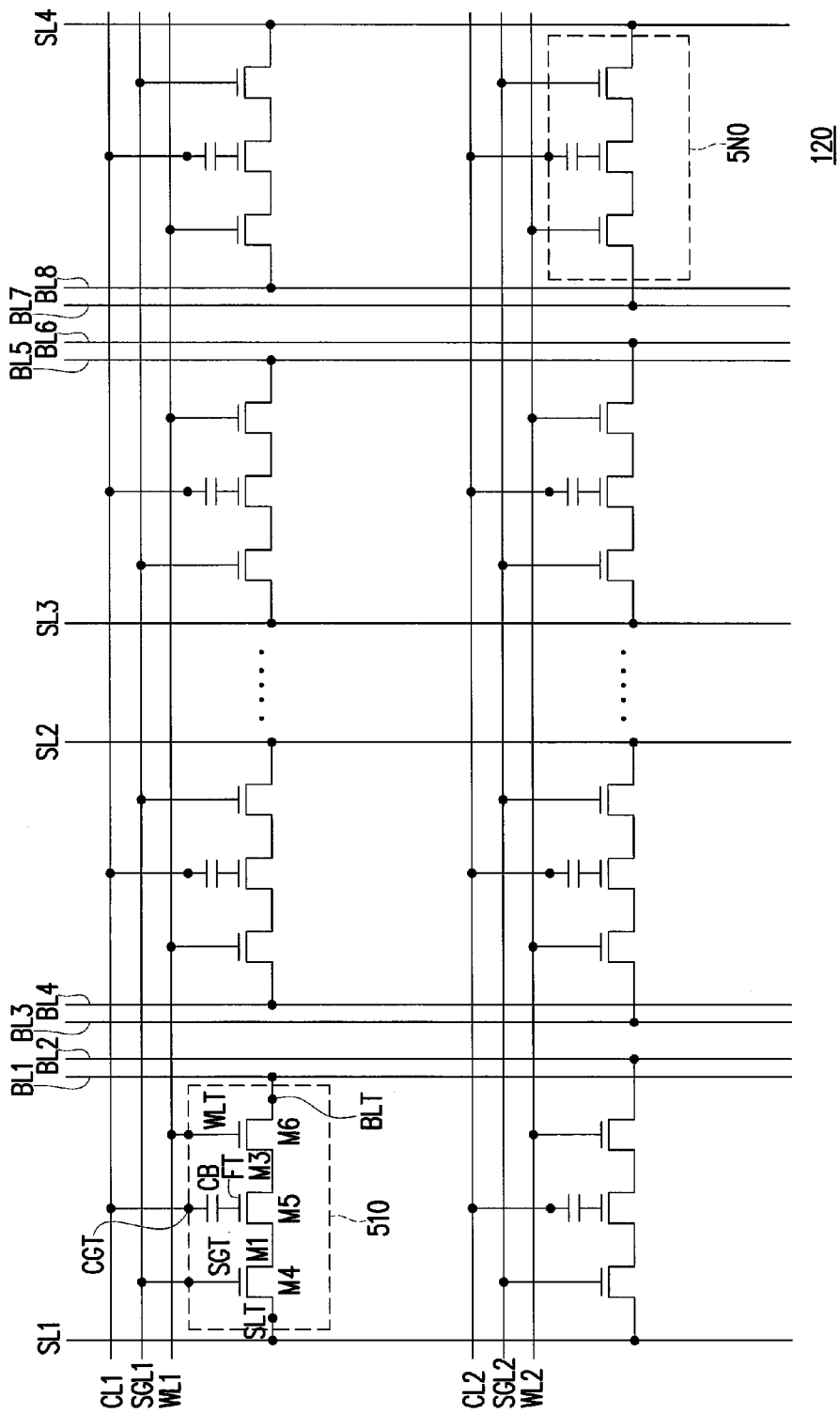
FIG. 5 is another embodiment of the circuit diagram of the array 120.

Referring to FIG. 5, FIG. 5 is another embodiment of the circuit diagram of the array 120. In FIG. 5, there are a plurality of memory cells 510-5N0 in the array 120, and the circuits of the memory cells 510-5N0 are different from the memory cells 121-12N in FIG. 2. For example, the memory cell 510 includes transistors M4, M5 and M6 and a boosting capacitor CB. The transistor M4 has a first terminal, a second terminal and a control terminal, and the first terminal of the transistor M4 is coupled to the source line terminal SLT, the control terminal of the transistor M4 is coupled to the selected gate terminal SGT. The boosting capacitor CB has a first terminal and a second terminal, and the first terminal of the boosting capacitor CB is coupled to the control gate terminal CGT, and the second terminal of the boosting capacitor CB is coupled to gate FT of the transistor M5, wherein the gate FT of the transistor 5 is floating. The transistor M5 has a first terminal, a second terminal and a control terminal, the first terminal of the transistor M5 is coupled to the second terminal of the transistor M4, the control terminal of the transistor M5 is coupled to the second terminal of the boosting capacitor CB. The transistor M6 has a first terminal, a second terminal and a control terminal, and the first terminal of the transistor M6 is coupled to the second terminal of the transistor M5, the control terminal is coupled to the word-line terminal WLT, the second terminal of the transistor M6 is coupled to the bit-line terminal BLT.

Figure 6:
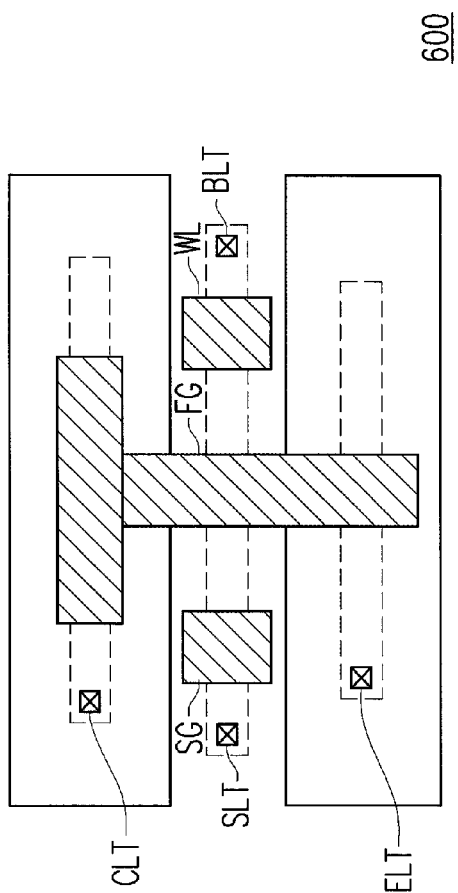
FIG. 6 is a top view of a nonvolatile memory cell 600.

Referring to FIG. 6, FIG. 6 is a top view of a nonvolatile memory cell 600. The nonvolatile memory cell 600 has a floating gate FG, a selecting gate SG a word-line receiving structure WL, a control line signal receiving terminal CLT, a source line signal receiving terminal SLT, a bit-line signal receiving terminal BLT and an erase line signal receiving terminal ELT. From the illustration of FIG. 6, it can be realized easily that there is a parasitical capacitor disposed between the floating gate FG and the channel of a transistor corresponding to the floating gate FG. For program inhibit operation of memory cell, when a programming signal transported to the control line signal receiving terminal CLT, the programming signal is transported the one terminal of the parasitical capacitor, and a channel voltage is generated at the other terminal of the parasitical capacitor because a boosting effect. Accordingly, the programming signal is transported to the channel directly.

Figure 7:
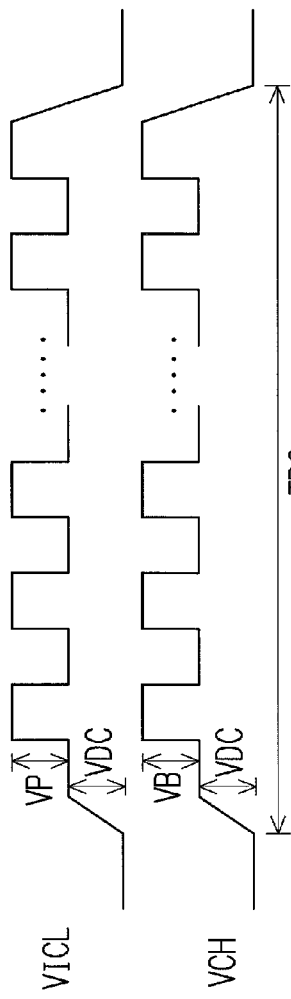
FIG. 7 is waveforms of the control signal and the channel voltage under program inhibit operation.

Referring to FIG. 6 and FIG. 7, FIG. 7 is waveforms of the channel voltage and the programming signal. When a memory cell is inhibited from programming period, the memory cell receives a programming signal VICL which is a pulse signal with a DC offset voltage, and the memory cell also receives a bit line signal which is larger than 0 volt. The maximum voltage level of the pulse signal is equaled to the voltage level VP+VDC, and the voltage level of the DC offset voltage is equaled to the voltage level VDC. Correspondingly, the channel voltage VCH is also equaled to a pulse signal with a DC offset voltage according to the boosting effect. The maximum voltage level of the pulse signal of the channel voltage VCH is equaled to the voltage level VB+VDC, and the voltage level of the DC offset voltage of the channel voltage VCH is equaled to the voltage level VDC. Wherein, the voltage VB is less than the voltage level VP.

In summary, in the invention, the programming signal which is a pulse signal VP with a DC offset voltage VDC applied on the memory cells which are inhibited can prevent program inhibit fail when the nonvolatile memory apparatus executing a programming operation. Therefore, the inhibited memory cell can reduce the leakage current by using this programming signal, and the performance of the nonvolatile memory apparatus is improved at advance technique.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A nonvolatile memory apparatus, comprising:
a plurality of memory cells, the plurality of memory cells are arranged in an array, each of the memory cells has a control gate terminal, a floating gate, a source line terminal, a bit-line terminal, a selected gate terminal and a word-line terminal, wherein each of the memory cells is configured as a structure of three transistors and one capacitor (3T1C), and the floating gate is a single-poly gate; and
a signal generator, coupled to the memory cells, when the nonvolatile memory apparatus executing a programming operating, the signal generator providing a programming signal to the control gate terminals of the memory cells,
wherein, the programming signal is a pulse signal with a direct-current (DC) offset voltage, when the nonvolatile memory apparatus executing the programming process, the signal generator further providing a first and a second bit-line signals to the bit-line terminals of the inhibited and non-inhibited memory cells respectively, wherein, the voltage level of the first bit-line signal is larger than the second bit-line signal.

2. The nonvolatile memory apparatus according to claim 1, wherein the source line terminals of the memory cells are coupled to a plurality of source signals respectively, the word-line terminals of the memory cells are coupled to a plurality of word line signals respectively, and the selected gate terminals of the memory cells are coupled to a plurality of selected gate signals respectively.

3. The nonvolatile memory apparatus according to claim 2, wherein the voltage level of each of the source signals is equal to or greater than 0 volt.

4. The nonvolatile memory apparatus according to claim 1, wherein each of the memory cells comprises:
a first transistor, having a first terminal, a second terminal and a first control terminal, the first terminal of the first transistor is coupled to the source line terminal, the first control terminal of the first transistor is coupled to the selected gate terminal;
a boosting capacitor, having a third terminal and a fourth terminal, the third terminal of the boosting capacitor is coupled to the control gate terminal;
a second transistor, having a fifth terminal, a sixth terminal and a second control terminal, the fifth terminal of the second transistor is coupled to the second terminal of the first transistor, the second control terminal of the second transistor is coupled to the fourth terminal of the boosting capacitor and serves as the floating gate; and
a third transistor, having a seventh terminal, an eighth terminal and a third control terminal, the seventh terminal of the third transistor is coupled to the sixth terminal of the second transistor, the third control terminal of the third transistor is coupled to the word-line terminal, the eighth terminal of the third transistor is coupled to the bit-line terminal.

5. The nonvolatile memory apparatus according to claim 1, wherein the DC offset voltage is larger than 0 volt.

6. The nonvolatile memory apparatus according to claim 1, wherein the pulse signal is a periodical signal.

* * * * *